(12) United States Patent
Tokumasu et al.

(10) Patent No.: US 6,221,755 B1
(45) Date of Patent: Apr. 24, 2001

(54) FILM FORMATION METHOD AND MANUFACTURING METHOD OF SEMICONDUCTOR DEVICE

(75) Inventors: Noboru Tokumasu; Kazuo Maeda, both of Tokyo (JP)

(73) Assignees: Canon Sales Co., Inc.; Semiconductor Process Laboratory Co., Ltd., both of (JP)

( * ) Notice: Subject to any disclaimer, the term of this patent is extended or adjusted under 35 U.S.C. 154(b) by 0 days.

(21) Appl. No.: 09/358,399

(22) Filed: Jul. 22, 1999

(30) Foreign Application Priority Data

Dec. 4, 1998 (JP) .................................................. 10-345404

(51) Int. Cl.$^7$ ............................................. H01L 21/4763
(52) U.S. Cl. ........................... 438/623; 438/632; 438/784; 438/789
(58) Field of Search ................................... 438/623, 632, 438/783, 784, 787, 788, 789, 790

(56) References Cited

U.S. PATENT DOCUMENTS

| | | | |
|---|---|---|---|
| 5,484,749 | * | 1/1996 | Maeda et al. ........................ 438/783 |
| 5,532,193 | * | 7/1996 | Maeda et al. ........................ 438/784 |
| 5,554,570 | * | 9/1996 | Maeda et al. ........................ 437/623 |
| 5,895,259 | * | 4/1999 | Carter et al. ......................... 438/563 |
| 5,915,200 | * | 6/1999 | Tokumasu et al. .................. 438/623 |
| 6,013,584 | * | 1/2000 | M'Saad ................................ 438/783 |

FOREIGN PATENT DOCUMENTS 10-135203    5/1998   (JP) .

OTHER PUBLICATIONS

William, D., et al., "LPCVD of Borophosphosilicate Glass . . . " J. Electrochem., vol. 134, No. 3, Mar. 1987, pp. 657–664.

Levin, R., et al., "The Step Coverage of Undoped . . . ", J. Vac. Sci. Technol. B, vol. 1, No. 1, Jan.–Mar. 1983, pp. 54–61.

Sato, J., et al., "Very Low Temperature CVD of $SiO_2$ Films . . . " Ext. Abs. of Spring Meeting Electrochemical Society Conf., 1971, pp. 31–33.

* cited by examiner

*Primary Examiner*—T. N. Quach
(74) *Attorney, Agent, or Firm*—Lorusso & Loud

(57) ABSTRACT

Disclosed is a film formation method of an interlayer insulating film which is flattened to cover a wiring layer of a semiconductor integrated circuit device, in which a film-forming gas is activated by converting the film-forming gas into a plasma, the film-forming gas being composed of either a mixed gas containing a phosphorus-containing compound containing trivalent phosphorus, which takes a Si—O—P structure, and a silicon-containing compound containing at most one oxygen atom or an additional mixed gas prepared by adding an oxidative gas to said mixed gas; and a silicon-containing insulating film containing $P_2O_5$ is formed on a substrate.

10 Claims, 15 Drawing Sheets

HMDSO + SOP - 11(b) + TMB or TEB + $O_2$   (Plasma)

FILM FORMATION METHOD AND MANUFACTURING METHOD OF SEMICONDUCTOR DEVICE

BACKGROUND OF THE INVENTION

The present invention relates to a method of forming a flattened interlayer insulating film covering a wiring layer of a semiconductor integrated circuit, and a method of manufacturing a semiconductor device.

In recent years, in the field of the semiconductor integrated circuit device, the density of a semiconductor integrated circuit is being prominently increased. In some cases, a multi-layer wiring including several layers is formed within the semiconductor integrated circuit. Since the wiring layer is formed of aluminum in many cases, a strong demand has been directed to the development of a method of forming a flattened interlayer insulating film at a low temperature, e.g., 500° C. or less.

FIG. 1 shows a related method of flattening an insulating film. In this method, a phosphorus-containing insulating film is formed by a thermal CVD (Chemical Vapor Deposition) method or a plasma-enhanced CVD method, followed by heating the phosphorus-containing insulating film so as to fluidize and flatten the insulating film. Also there are an etch back method shown in FIG. 2 and a CMP (Chemical Mechanical Polishing) method shown in FIG. 3. In these related etch back method and the CMP method, the irregularity on the surface of the insulating film is eliminated by etching and polishing, respectively.

In the flattening method based on fluidization by heating, a BPSG film 4 is formed as shown in FIG. 1A by using any of the reactant gases below. In the case of the thermal CVD method, any of the groups of the reactant gases given below are used:

(1) $SiH_4+PH_3+B_2H_6+O_2$ ($PH_3$: Phosphine
(2) TEOS+TMOP+TMB or TEB+$O_2$ or $O_3$ TEOS: tretra-ethoxysilane ($Si(OC_2H_5)_4$), TMOP: trimetylphosphate ($PO(OCH_3)_3$))

Alternatively, in the case of the plasma-enhanced CVD method, any of the groups of the following reactant gases are employed.

(1) $SiH_4+PH_3+B_2H_6+O_2$
(2) TEOS+TMOP+TMB or TEB+$O_2$

Concerning this method, the particular technique is disclosed in, for example, a publication "Williams, D. S. and Dein, E. A.: J. Electrochem. Soc., 134,: 657, 1987, Levin, R. M. and Evans -Lutterodt, K.: J. Vac. Sci. Thechnol., BI, 1:54, 1983, Sato, J. and Maeda, K.: Extended Abstract of Elecrochem. Soc. Spring Meeting: 31, 1971".

Thereafter, the formed BPSG film 4 is heated at a temperature of about 850° C., as shown in FIG. 1B, to fluidize and flatten the film 4. It should be noted that in the case of a PSG film, the film is formed by the thermal CVD method or the plasma-enhanced CVD method using a reactant gas other than the boron-containing gases ($B_2H_6$, TMB or TEB) among the above described reactant gases, and then the film is heated at a temperature below 1000° C. to fluidize and flatten the film.

In the case of the method of flattening the film by etching or CMP method, an NSG film (Nondoped Silicate Glass film) 5 is first formed by the thermal CVD method or the plasma-enhanced CVD method using the following reactant gases as shown in FIGS. 2A and 3A, and then the film is flattened.

(1) $SiH_4+O_2$ (thermal CVD method or plasma-enhanced CVD method)
(2) TEOS+$O_2$ or $O_3$ (thermal CVD method)
(3) TEOS+$O_2$ (plasma-enhanced CVD method)

In the etch-back method, as shown in FIG. 2B, the resist film 6 is formed on the NSG film 5 by a spin coating method, followed by flattening the resist film 6. Then, as shown in FIG. 2C, the film is subjected to an etching that is performed from the upper portion of the film 5, thus forming the flattened NSG film 5a. Moreover, in the CMP method, as shown in FIG. 3B the NSG film 5 is formed and, then polished to obtain the flattened NSG film 5b.

It should be noted that in the foregoing FIGS. 1 to 3, reference numeral 1 denotes a semiconductor substrate. Reference numeral 2 denotes an underlying insulating film. Further, each of reference numerals 3a and 3b denotes a wiring layer formed on the underlying insulating film 2.

In the flattening method using the etch-back method and the CMP method, the film is not heated unlike the flattening method utilizing thermal fluidization. Thus, the etch-back method and the CMP method are effective when that flattening of the film must be performed at a low temperature. Nevertheless, when voids are formed in concave portions between the wiring layers 3a and 3b and in the other concave portions immediately after the formation of the original insulating film 5, these voids remain as they were even after the flattening treatment as shown in FIGS. 2 and 3.

Methods of forming the insulating film providing a good burying property includes, for example, a high density plasma-enhanced CVD method, a ordinary plasma-enhanced CVD method, a normal pressure thermal CVD method, and an SOG (Spin-On-Glass) coating method. However, since flattening using these methods does not utilize the thermal fluidity of the film, when a space between the wiring layers is particularly narrowed by a high integration level of the device, it will be difficult to perfectly bury the concave portion therebetween.

On the other hand, since the film surface flattening method in which the film is flattened by heating and fluidizing the film utilizes the thermal fluidity of the film, it can be expected that the concave portion can be perfectly buried as shown in FIG. 1. At present, particularly, the BPSG film (boro-phospho silicate glass film) 4 is often used for such a purpose. However, in order to fluidize the BPSG film 4, the BPSG film 4 must be heated at least at a temperature higher than 850° C., and this BPSG film cannot be used as the underlying film of the wiring layers 3a and 3b as well as the interlayer insulating film 4, which must be formed at a low temperature.

In this case, if concentrations of phosphorus and boron are set at high level, a temperature for fluidizing the film (hereinafter referred to as a fluidizing temperature) can be decreased to some extent. However, this is unsatisfactory yet, resulting in a new problem in that stability of the interlayer insulating films 2 and 4 and resistance to humidity thereof are degraded. Note that the PSG film requires a fluidizing temperature approximately identical to that for the BPSG film and the above described problem is produced.

Moreover, as an insulating film which requires a low fluidizing temperature, a GBPSG film obtained by adding $GeO_2$ to the BPSG film has been developed. However, with reference to the GBPSG film, the fluidizing temperature can be lowered to only about 750° C., and it is difficult to apply the BPSG film to the underlying film and the interlayer insulating film which requires a lower fluidizing temperature.

SUMMARY OF THE INVENTION

The object of the present invention is to provide a film-forming formation method which is capable of significantly decreasing the fluidizing temperature for flattening a film, and a method of manufacturing a semiconductor device.

The summary of the present invention will be described below.

The inventors of the present invention paid heed to the following facts.

(1) The conventional BPSG film and the PSG film are mixtures formed of $SiO_2+P_2O_5+B_2O_3$ and $SiO_2+P_2O_5$, respectively. Note that $PH_3$ contained in the conventional reactant gases, i.e., $SiH_4+PH_3+B_2H_6+PH_3$ is a trivalent phosphorus, and bonds with oxygen supplied from the outside to generate, not $P_2O_3$ but $P_2O_5$. It is considered reasonable to understand that $PH_3$ itself contains no oxygen and stable $P_2O_5$ is generated easily when phosphorus bonds with oxygen supplied from the outside.

(2) With reference to the BPSG film containing $P_2O_5$ and $SiO_2$, it theoretically exhibits an eutectic point of 850° C. at a composition of 20 to 80% of $P_2O_5$, and a melting point of $P_2O_5$ itself is a key to a fluidizing temperature of the BPSG film.

(3) $P_2O_3$ exhibits a melting point prominently lower than that of $P_2O_5$ as shown in the following.

TABLE 1

| $P_2O_3$ | (trivalent) | melting point: | 23.8° C. |
| | | boiling point: | 175.4° C. |
| $P_2O_5$ | (pentavalent) | melting point: | 580 to 585° C. |
| | | boiling point: | 300° C. |
| | | (sublimation) | |

Accordingly, the inventors thought that the fluidizing temperature could be decreased if the BPSG film and the PSG film are made to mainly contain $P_2O_3$ instead of $P_2O_5$.

In order to form the BPSG film and the PSG film containing a high concentration of $P_2O_3$, the inventors intended to oxidize a phosphorus-containing compound under the state of oxygen deficiency. As a method to achieve this, the following are adopted: (1) a phosphorus-containing compound that contains trivalent phosphorus is used as a film formation gas, and (2) the film formation is conducted using a silicon-containing compound containing a small amount of oxygen and a phosphorus-containing compound.

As the phosphorus-containing compound applicable to the method (1) or (2), for example, it is possible to use a phosphorus-containing compound having a Si—O—P structure as shown in the following structural formulae.

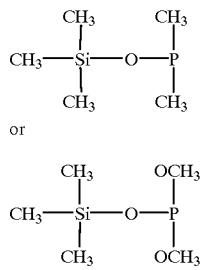

As the silicon-containing compound applicable to method (2), there is a silicon-containing compound containing at most one atom, for example, hexamethyldisiloxane (HMDSO) and the like.

Moreover, in order to reduce the oxygen content of the film-forming gas, it is also effective to use a film-forming gas formed of only a phosphorus-containing compound and a silicon-containing compound, in which an oxidative gas is not added. This film-forming gas contains carrier gases of these compounds. However, when the oxidative gas is not added to the film-forming gas, the film-forming rate decreases. Accordingly, the oxidative gas, e.g., $O_2$ gas, should be added in amount of, for example, 15 sccm or less, more suitably 10 sccm or less, if possible, such that the state of oxygen shortage can be maintained to permit a trivalent phosphorus component to be contained in the phosphorus-containing insulating film and that the film-forming rate of a reasonable level can be maintained.

Using the film-forming gas in which the oxidative gas is not added to a gas mixture containing the foregoing phosphorus-containing compound and the silicon-containing compound, or the film-forming gas to which the oxidative gas is added, the phosphorus-containing insulating film, for example, the PSG film, the BPSG film and the like, was formed by a plasma-enhanced CVD method. When the components of this phosphorus-containing insulating film are analyzed by a Fourier transformation infrared specrophotometric (FTIR) method, it can be confirmed that $P_2O_3$ of a high concentration exists in the phosphorus insulating film. Then, the fluidizing temperature approximately identical to the film formation temperature of about 240 to 430° C. was achieved.

Moreover, it was found that the fluidizing temperature can be adjusted by adjusting the concentration of $P_2O_3$. It was also found that the concentration of $P_2O_3$ can be easily adjusted by adjusting the film formation temperature, the oxygen concentration and the gas flow rate of the phosphorus-containing compound.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENTS

Figure 1A:
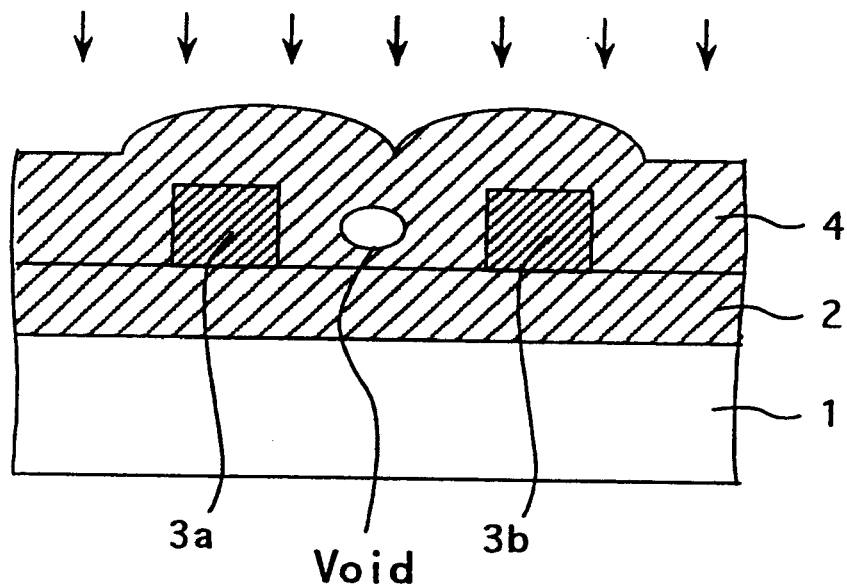
FIGS. 1A and 1B are sectional views, collectively showing a conventional method of forming an interlayer insulating film in which the film is flattened by heating.
Figure 1B:
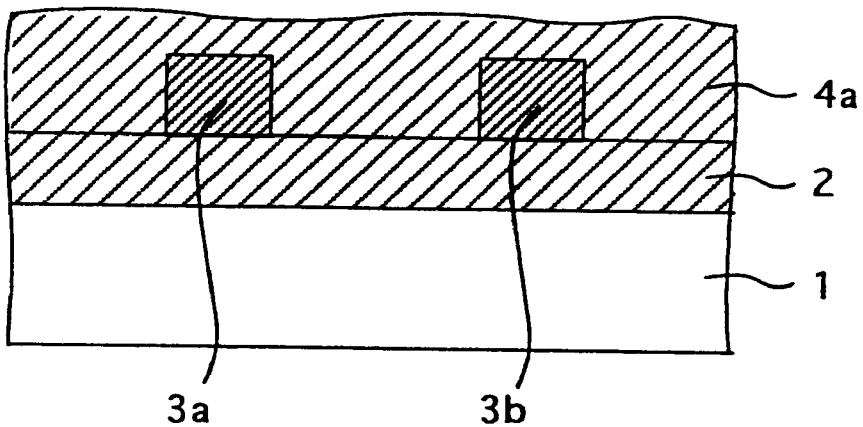
Figure 2A:
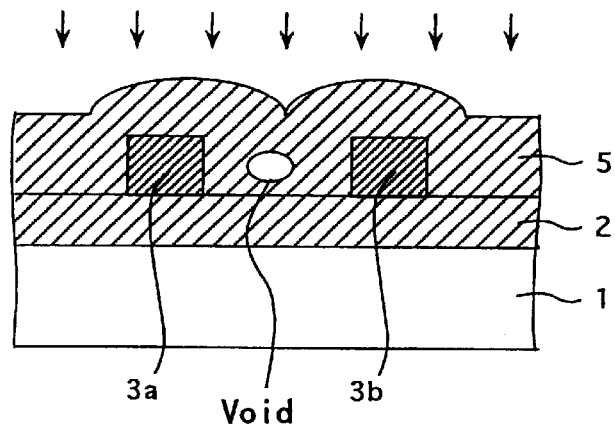
FIGS. 2A to 2C are sectional views, collectively showing a conventional method of forming an interlayer insulating film in which the film is flattened by an etch-back.
Figure 2B:
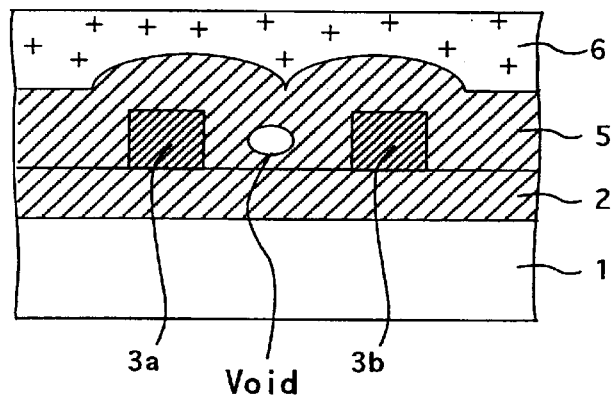
Figure 2C:
Figure 2C:
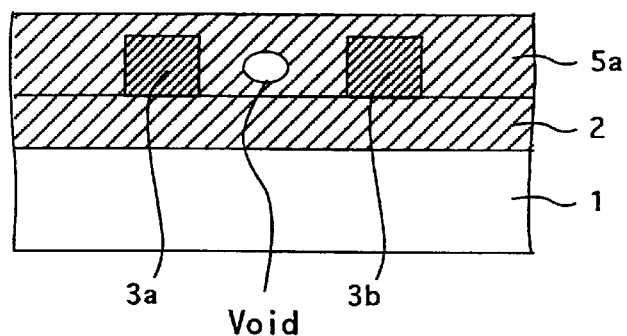
Figure 3A:
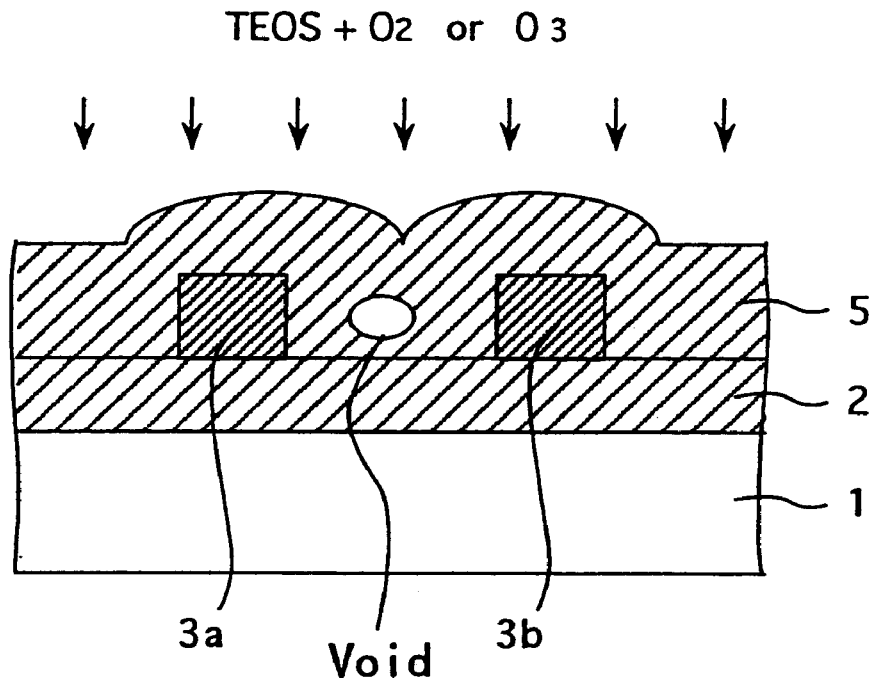
FIGS. 3A and 3B are sectional view, collectively showing a conventional method of forming an interlayer insulating film in which the film is flattened by polishing using a CMP method.
Figure 3B:
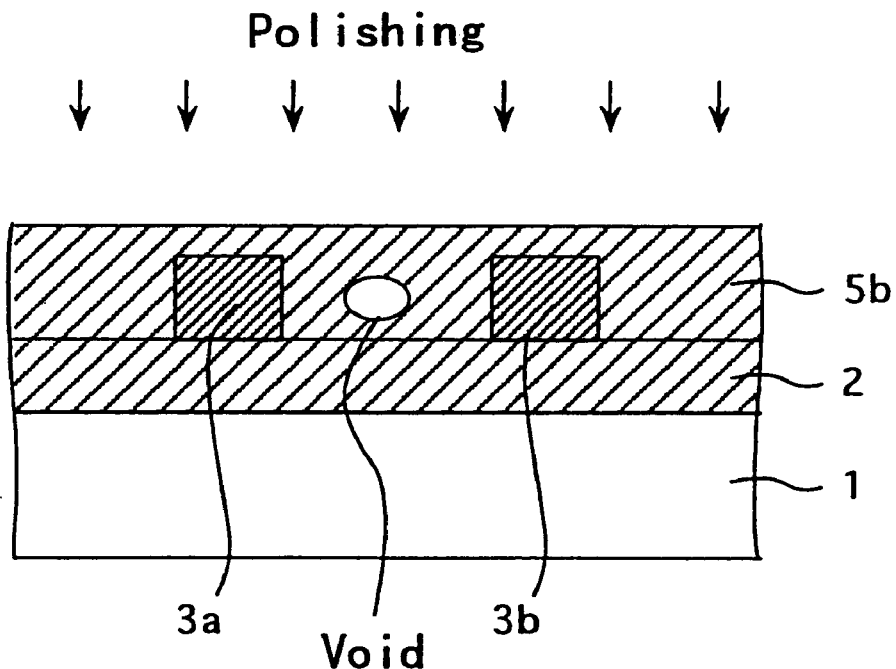

Embodiments of the present invention will be described with reference to the accompanying drawings below.

(1) First Embodiment

A method to form a PSG film by a plasma CVD method according to a first embodiment of the present invention will be described.

As a phosphorus-containing compound, a phosphorus-containing compound having a Si—O—P structure of the structural formula shown below (phosphorus acid dimethyl trimethylsilylester (hereinafter, referred to as an SOP-11(a)) and phosphorus acid dimethoxy trimethylsilylester (hereinafter, referred to as an SOP-11 (b)) can be used. The structural formula of the SOP-11 (a) is as follows.

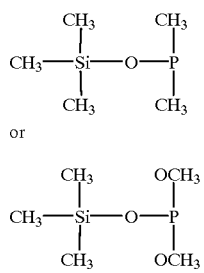

Moreover, the structural formula of the SOP-11(b) is as follows.
Hereupon, the SOP-11(b) was used.

As a silicon-containing compound containing at most one oxygen atom, alkyl silane or aryl silane (general formula: $R_nSiH_{4-n}$ (n=1~4)), alkoxy silane (general formula $ROSiH_3$), chain siloxane (general formula $R_nH_{3-n}SiOSiH_{3-n}R_n$ (n=1~3)) can be used. Note that in these chemical formulae, R denotes an alkyl group, an aryl group or their derivative, and n is zero or a positive integer.

Used herein is, particularly, hexamethyldisiloxane (HMDSO: $(CH_3)_3SiOSi(CH_3)_3$) smaller than TEOS in the number of oxygen atoms, carbon atoms contained and hydrogen atoms therein. The reason is that hexamethyldisiloxane is chemically stable and not prone to react with water because of the small numbers of carbon atoms and hydrogen atoms contained therein. Moreover, the number of oxygen atoms contained in hexamethyldisiloxane is small, with the result that the state of oxygen shortage during the film formation can easily be obtained, resulting in a high $P_2O_3$ content in the grown film.

Furthermore, as an oxidative gas, oxygen ($O_2$), carbon monoxide (CO), carbon dioxide ($CO_2$), nitride monoxide (NO), nitrous oxide ($N_2O$), nitride dioxide ($NO_2$) and the like can be used. Hereupon, $O_2$ is used. Note that for maintaining the state of the oxygen shortage to a degree in which trivalent phosphorus is contained in the phosphorus-containing insulating film, the oxidative gas may not be added. However, if the oxidative gas is not added, the film-forming rate decreases. For this reason, the oxidative gas should be added at an appropriate amount. For example, oxygen $O_2$ gas should be added in an amount of 15 sccm or less, more suitably 10 sccm or less if possible, such that the state of oxygen shortage can be maintained to a degree that trivalent phosphorus is contained in the phosphorus-containing insulating film and the film-forming rate can be maintained to some extent.

As described above, mixed gas composed of SOP-11(b), HMDSO and $O_2$ is used as the film-forming gas, and the film-forming conditions should be as follows.

TABLE 2

| | |
|---|---|
| Substrate Temperature: | 150 to 250° C. |
| Gas Pressure: | 2 to 10 Torr |
| Flow Rate of SiOP-11(b) Bubbling Gas ($N_2$ or Ar): | 300 to 800 sccm |
| (SiOP-11(b) Source Temperature: 45° C.) | |
| Flow Rate of HMDSO Bubbling Gas ($N_2$ or Ar): | 200 to 600 sccm |
| (HMDSO Source Temperature: 10° C.) | |
| Flow Rate of Oxidative Gas ($O_2$): | below 15 sccm |
| RF Power: | 150 to 300 W |
| Frequency: | 380 kHZ to 2.45 GHZ |

To use the liquid source, SOP-11(b) was heated to 45° C. and HMDSO was cooled to 10° C. Then, these liquid sources were bubbled with carrier gas ($N_2$ or Ar) so as to mix it into the carrier gas. By adjusting the flow rate of the carrier gas, the supply amount of SOP-11(b) and HMDSO was adjusted.

Figure 6:
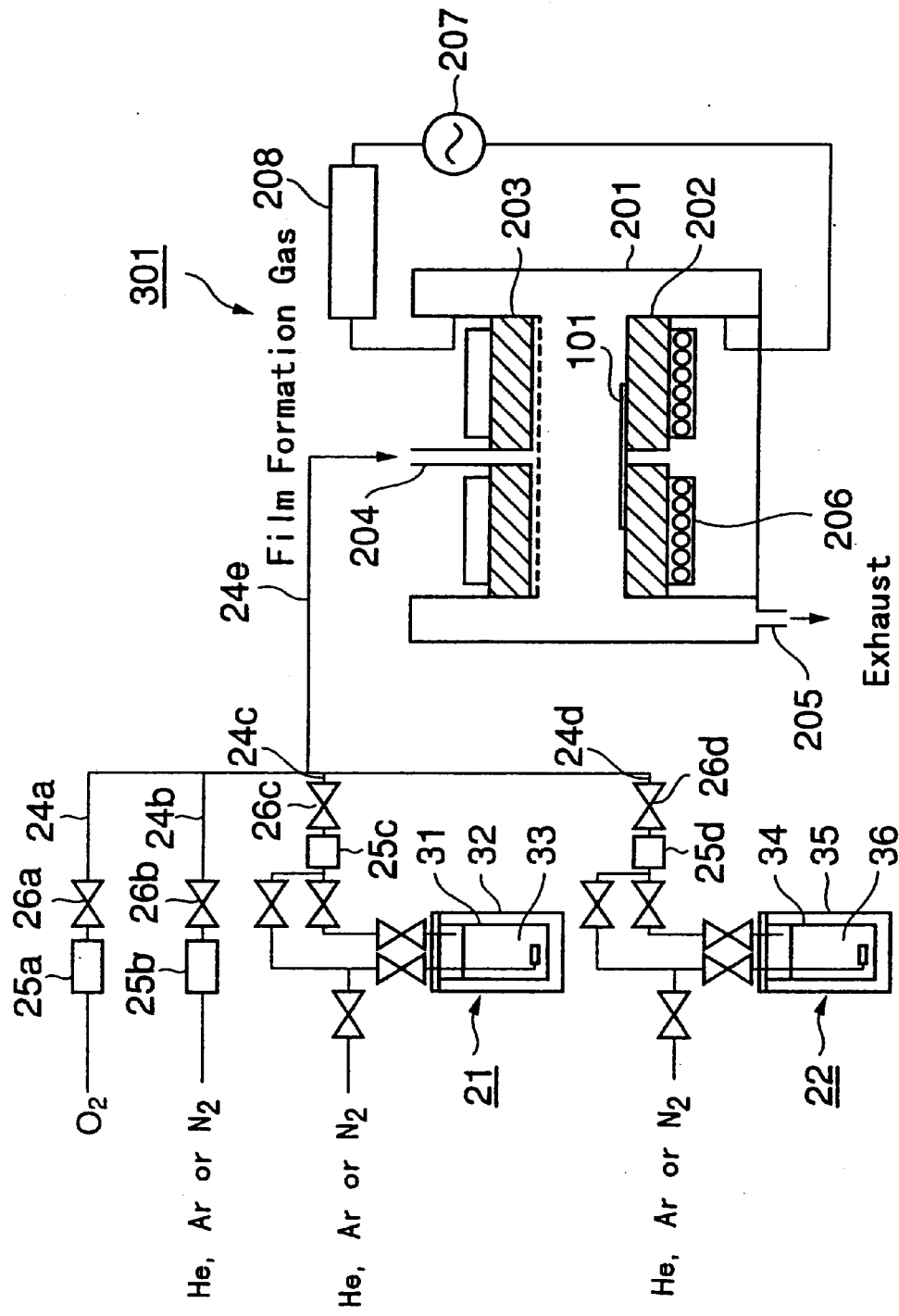
FIG. 6 is a side view showing a structure of a film formation apparatus used for the film formation method according to the embodiment of the present invention.

Moreover, a PECVD apparatus shown in FIG. 6 was used as the film formation apparatus. As shown in FIG. 6, the film formation apparatus 301 comprises the upper electrode 203 and the lower electrode 202 of a parallel plane type in the chamber 201. The RF power source 207 is connected between the upper and lower electrodes 203 and 202. The RF power source 207 supplies a RF power of a frequency of 13.56 MHz to convert the film-forming gas into a plasma. A pressure in the chamber 201 is reduced to an appropriate value by exhausting the air from the chamber 201 using an exhaustion apparatus connected to the exhaustion port 205. Moreover, the lower electrode 202 serves also as a substrate placing stage for placing the substrate 101 on which the film is to be formed (hereinafter referred to as a substrate 101).

The heating means 206 for heating the substrate 101 is provided in the vicinity of the lower electrode 202.

Furthermore, the supply source 21 of SOP-11(b) is provided as the phosphorus-containing compound source 33; the supply source 22 of HMDSO, as the silicon-containing compound source 36; the supply source of $O_2$, as the oxidative gas; and the supply source of He, Ar or $N_2$, as the diluent gas source. The supply sources are collectively connected to the gas inlet portion 204 of the chamber 201 of the film formation apparatus 301 through the pipe 24.

Note that the RF power source 207 is connected to the upper electrode 203 through the matching circuit 208. In FIG. 6, other reference numerals 24a to 24d denote a pipe for guiding each gas. Reference numerals 25a to 25d denote a flow meter, and reference numerals 26a and 26b denote a valve for opening and closing the flowing path of the source gas provided in the pipes 24a to 24d. Reference numerals 32 and 35 denote means for adjusting the temperature of the source, which are a heater, a cooler and the like.

Figure 4A:
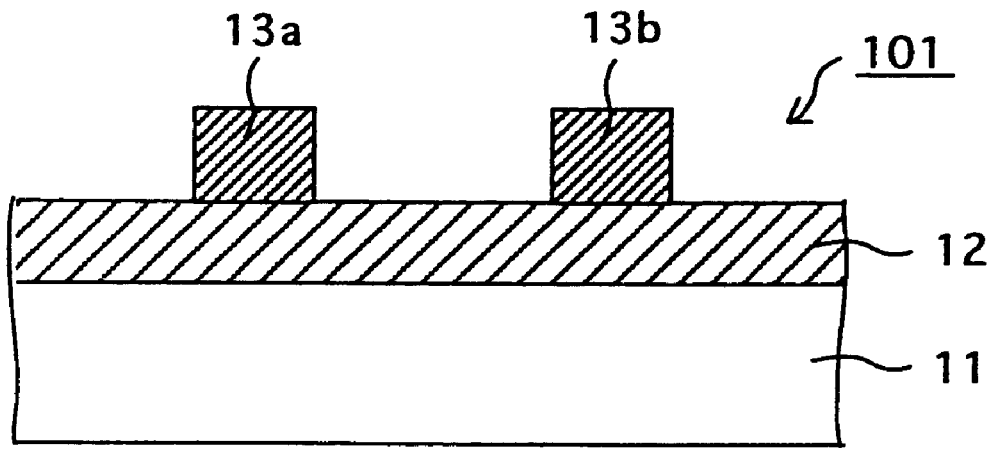
FIGS. 4A and 4B are sectional view, collectively showing a film formation method of a PSG film containing $P_2O_3$ according to a first embodiment of the present invention.

First, the substrate 101 shown in FIG. 4A, on which the film is to be formed, is introduced into the chamber 201 of the PECVD apparatus constructed as described above. Subsequently, the substrate 101 is heated to maintain the temperature of the substrate within the range of the Table 2.

Note that the substrate 101 on which the film is to be formed is constructed such that the underlying insulating film 12 such as a silicon oxide film is formed on the silicon substrate (semiconductor substrate) 11, and the wiring layer 13 formed of, for example, an aluminum film is formed on the underlying insulating film 12.

Figure 4B:
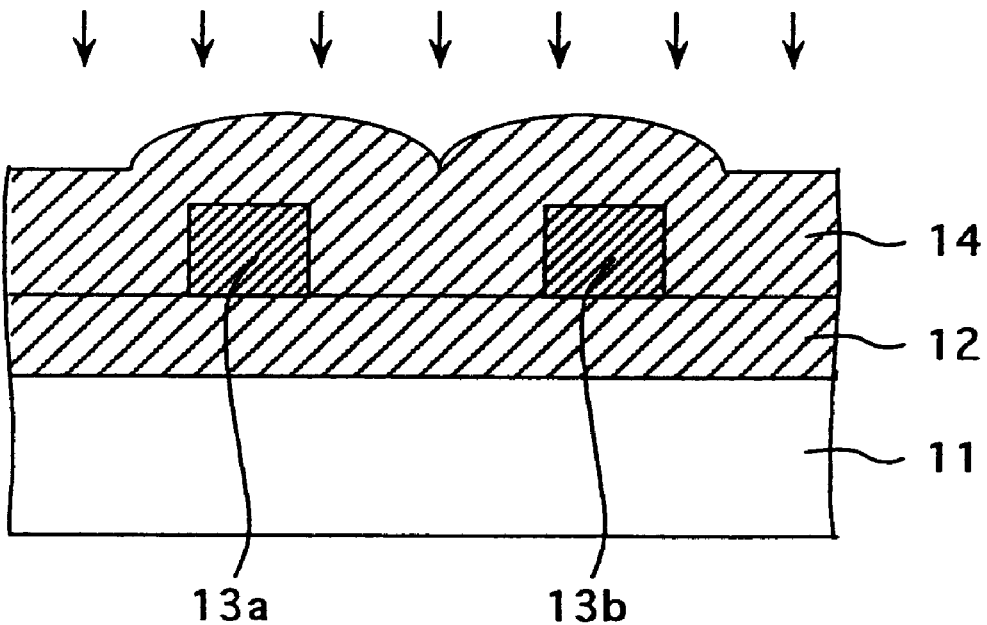

Next, as shown in FIG. 4B, the film-forming gas which was controlled so as to fall within the range of the film formation condition shown in FIG. 2 is introduced into the chamber 201, and the film-forming gas is converted into plasma by the RF power of the Table 2, thereby activating it.

This situation is kept for a predetermined period of time, whereby the PSG film (phosphorus-containing insulating film) 14 of a predetermined thickness containing a high concentration of $P_2O_3$ is formed. At this time, by a concentration of $P_2O_3$ or a ratio of $P_2O_3$ to $P_2O_5$, the fluidizing temperature of the PSG film 14 can be controlled so as to fall within a range of 200 to 500° C. For this reason, the PSG film 14 may be fluidized, so that the formation of the film and flattening of the film can be achieved in this case.

Figure 5A:
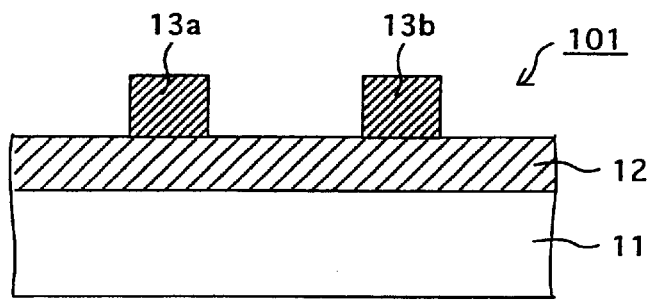
FIGS. 5A to 5C are sectional views, collectively showing another film formation method of forming a PSG film containing $P_2O_3$ according to a first embodiment of the present invention.
Figure 5B:
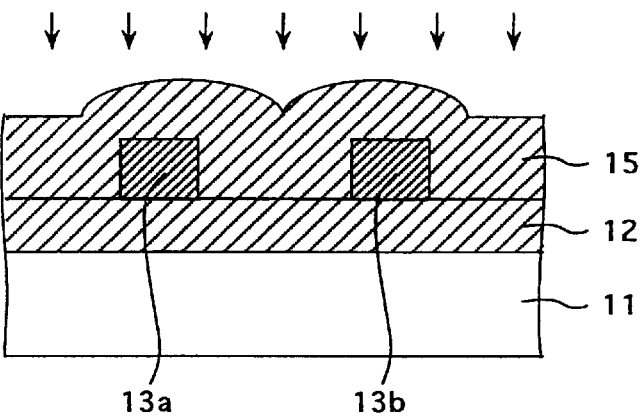
Figure 5C:
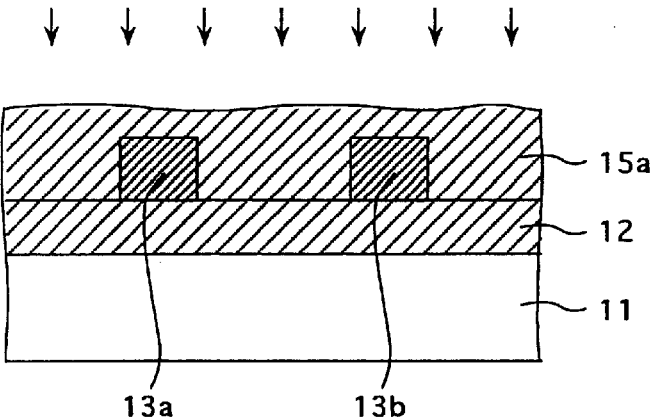

Alternatively, if not so, the PSG film (phosphorus-containing insulating film) 15 is formed on the substrate 101 as shown in FIGS. 5A to 5C, and then a thermal treatment for flattening the film 15 is conducted, thereby fluidizing the film 15. Thus, the film 15 is flattened. With such processings, the flattened PSG film 15a is formed.

Next, the investigation results of the film-forming rate in the film formation steps of the above described steps will be described with reference to FIG. 9.

Figure 9:
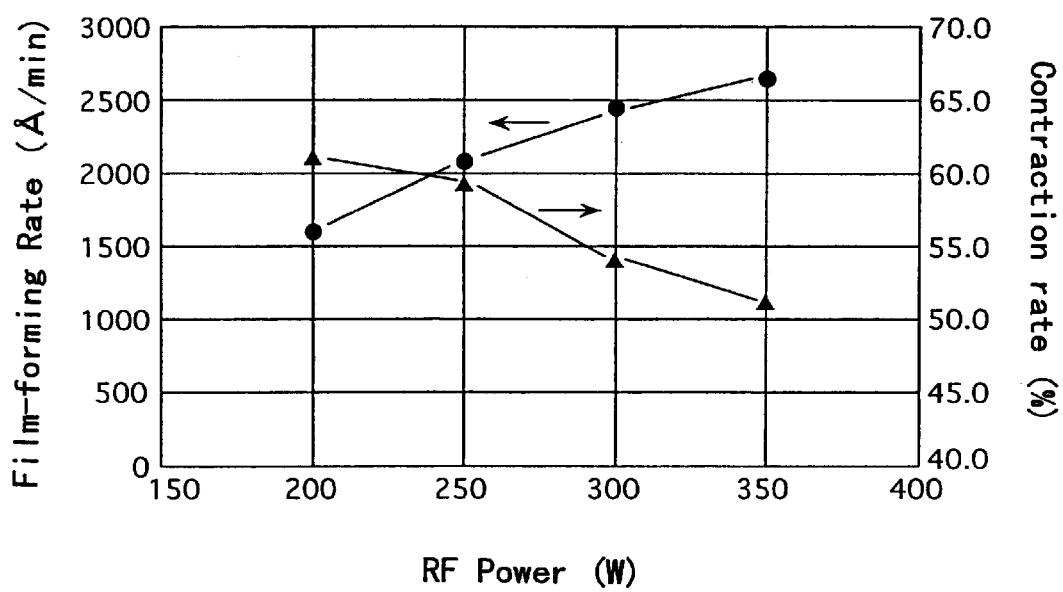
FIG. 9 is a graph showing a correlation between a RF power and a phosphorus-containing insulating film formed by the film formation method according to the embodiment of the present invention.

FIG. 9 is a graph showing a dependency of the film-forming rate on the RF power in the PECVD method.

The ordinate on the left side of FIG. 9 shows the film-forming rate (Å/min.) illustrated by linear scales, and the abscissa shows the RF power (W) illustrated by the linear scales.

The film-forming conditions of the sample used for the investigation are as follows.

TABLE 3

| | |
|---|---|
| Substrate Temperature: | 170° C. |
| Gas Pressure: | 10 Torr |
| Total Gas Flow Rate: | 940 sccm |
| SiOP-11(b)/HMDSO Flow Rate (Ar Carrier Gas): | 1.6 |
| (SiOP-11(b) Source Temperature: 45° C. | |
| HMDSO Source Temperature: 10° C.) | |
| Flow Rate of Oxidative Gas ($O_2$): | 1 to 15 sccm |
| RF power: | 200 to 350 W |
| Frequency: | 13.56 MHz |

According to the investigation result of FIG. 9, by adding oxygen of an appropriate amount (1 to 15 sccm, preferably 2 to 10 sccm) to the silicon-containing compound HMDSO containing one oxygen atoms or less, the film-forming rate can be increased to about 40 to 60% compared to the case where oxygen is not added, while securing the situation of oxygen shortage.

Note that in FIG. 9, the investigation results as to the dependency on the contraction rate of the phosphorus-containing insulating film on the RF power is also recited in addition to the film-forming rate. Hereupon, the contraction rate is defined by a ratio (%) of the film thickness after annealing to the film thickness before annealing, that is, (the film thickness after annealing)/(the film thickness before annealing)×100.

In this case, the ordinate on the right side of FIG. 9 shows the contraction rate (%) of the phosphorus-containing insulating film, which is expressed by the linear scales, and the abscissa shows the RF power (W) expressed by the linear scales.

As the sample for the investigation, a sample which has been subjected to the annealing under the conditions of Table 4 after the above described film formation was used. As description for the annealing treatment is to be made in a third embodiment in detail, detailed description is omitted here.

TABLE 4

| Annealing Conditions | |
|---|---|
| First Atmosphere Gas: | $N_2$ |
| Treatment Temperature: | 650° C. |
| Time: | 15 minutes |
| Second Atmosphere Gas: | $O_2$ |
| Treatment Temperature: | 650° C. |
| Time: | 15 minutes |

According to the film formation method of the first embodiment, hexamethyldisiloxane (HMDSO) having one oxygen atom or less is used as the silicon-containing compound, SiOP-11 (b) is used as the phosphorus-containing compound, and the oxidative gas, e.g., $O_2$ gas, is added in a suitable amount of 15 sccm or less.

Accordingly, the amount of oxygen in the total film-forming gas can be decreased, and the PSG film 15 containing a high concentration of $P_2O_3$ can be formed. Therefore, the fluidizing temperature can be decreased to 500° C. or less.

In addition, since oxygen ($O_2$) is added as the oxidative gas by an appropriate amount, that is, by 15 sccm or less, the film-forming rate of a reasonable level can be maintained.

(2) Second Embodiment

Figure 7A:
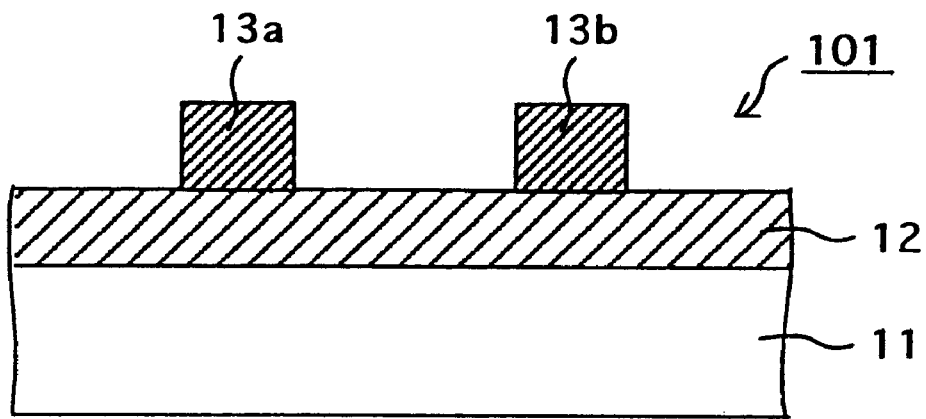
FIGS. 7A and 7B are side views, collectively showing of a film formation method of forming a BPSG film according to a second embodiment of the present invention.

Next, a formation method of a BPSG film containing $P_2O_3$ by a plasma-enhanced CVD method according to a second embodiment of the present invention will be described with reference to FIGS. 7A and 7B.

A mixed gas containing HMDSO+SOP-11(b)+TMB or TEB+$O_2$ was used as the film-forming gas. The film-forming conditions were as follows.

TABLE 5

| | |
|---|---|
| Substrate Temperature: | 150 to 250° C. |
| Gas Pressure: | 2 to 10 Torr |
| Flow Rate of SiOP-11(b) Bubbling Gas ($N_2$ or Ar): (SiOP-11 (b) Source Temperature: 45° C.) | 300 to 800 sccm |
| Flow Rate of HMDSO Bubbling Gas ($N_2$ or Ar): (HMDSO Source Temperature: 10° C.) | 200 to 600 sccm |
| TMP Flow Rate: | 5 to 200 sccm |
| TMB or TEB Flow Rate: | 3 to 400 sccm |
| Oxidative Gas ($O_2$) Flow Rate: | 15 sccm or less |
| RF power: | 150 to 300 W |
| Frequency: | 380 kHz to 2.45 GHz |

Figure 7B:
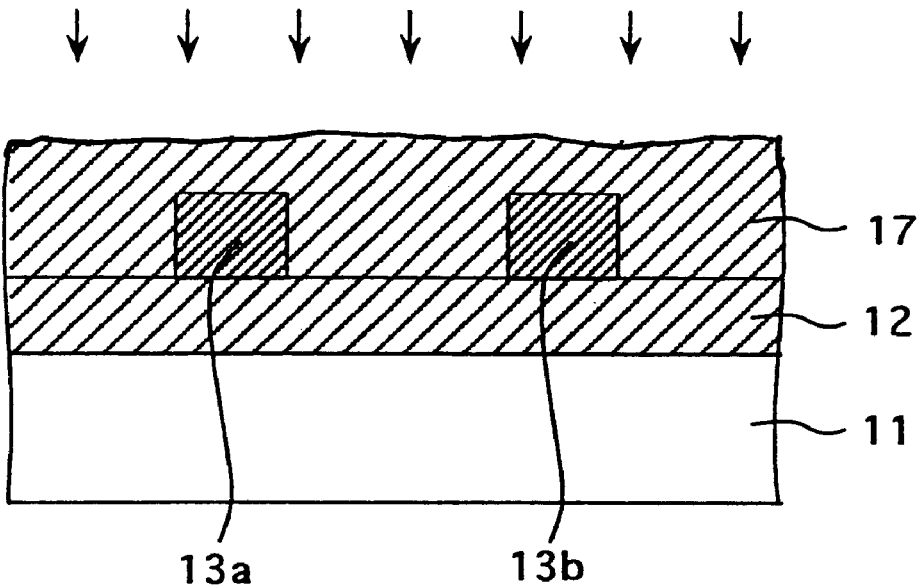

Under the conditions described above, the BPSG film (phosphorus-containing insulating film) 17 formed of the mixture containing $SiO_2+P_2O_3+B_2O_3$ is formed on the substrate 101 as shown in FIG. 7B. Note that FIG. 7A shows a sectional view of the substrate 101 before the film formation.

As in the first embodiment, the concentration of $P_2O_3$ or the ratio of $P_2O_3/P_2O_5$ is controlled by controlling the oxygen concentration, the substrate temperature, the phosphorus-containing compound or the boron-containing compound. Thus, the fluizing temperature of the BPSG film 17 can be controlled so as to fall within a range of 200 to 500° C.

In addition, since oxygen ($O_2$) is added as the oxidative gas in an appropriate amount, that is, 15 sccm or less, a reasonable film-forming rate can be maintained.

(3) Third Embodiment

By the way, since $P_2O_3$ itself easily reacts with water, when the PSG films 14 and 15a and the BPSG film 17 formed in the above described manner are taken out in the air after forming them, they will absorb moisture. Accordingly, in order to use these films as an interlayer insulating film of the semiconductor device, it is necessary to stabilize the PSG films 14 and 15a and the BPSG film 17, which contain $P_2O_3$, so that they do not absorb moisture.

Figure 8:
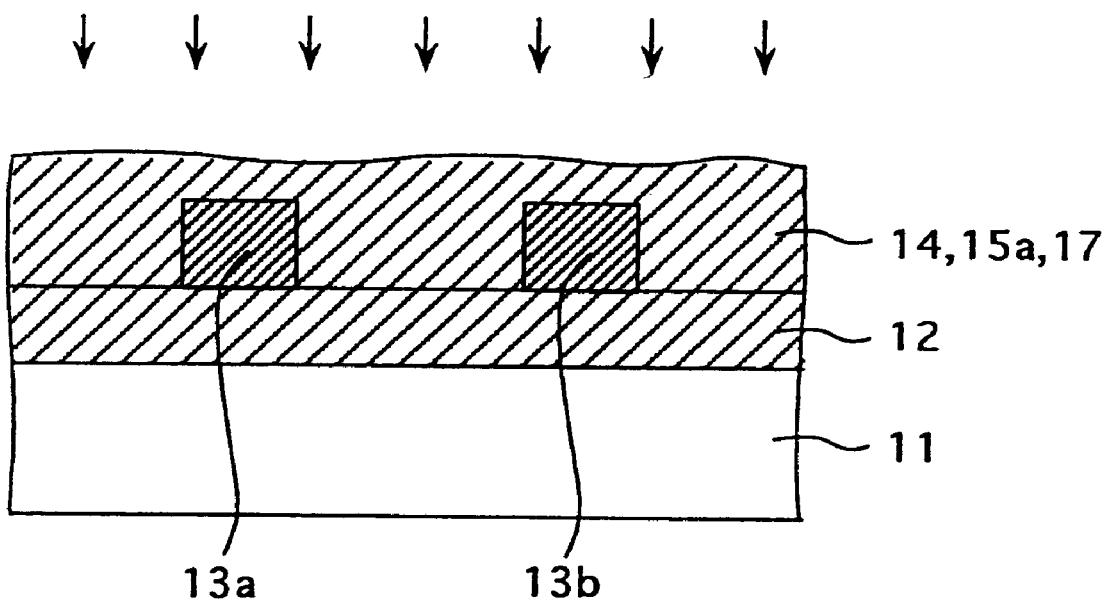
FIG. 8 is a side view showing of a film formation method according to a third embodiment of the present invention.

Next, a method to stabilize the PSG films 14 and 15a and the BPSG film 17, which contain $P_2O_3$, will be described with reference to FIG. 8.

After the film is formed by the film formation method of the first embodiment, a substrate on which the film was formed is introduced into the chamber, and the substrate is heated to a temperature of 650° C.

Next, $N_2$ is introduced into the chamber, and annealing is performed for about 15 minutes at the substrate temperature of 650° C. in an atmosphere of nitrogen. Subsequently, the introduction of nitrogen into the chamber is stopped, and oxygen is introduced into the chamber, followed by annealing the substrate for about 15 minutes at the substrate temperature of 650° C. in an atmosphere of nitrogen.

By these annealings, $P_2O_3$ contained in the PSG films 14 and 15a and the BPSG film 17 can be converted into $P_2O_5$.

As described above, after the film formation, annealing is performed in the atmosphere of nitrogen and oxygen, whereby the PSG films 14 and 15a and the BPSG film 17 are stabilized by conversion $P_2O_3$ to $P_2O_5$. Moreover, the final composition of $P_2O_5$ allows the PSG films 14 and 15a and like to exhibit a passivation effect and contributes to the stabilization of the interface characteristic. Note that residual carbons contained in the phosphorus-containing insulating film is simultaneously oxidized by the annealing.

Because moisture absorption properties of the PSG films 14 and 15a and the BPSG film 17 are improved by the above described processes, it will be possible to apply them to the semiconductor devices.

Note that a cover insulating film for preventing the films from absorbing the moisture may be formed on the PSG films 14, 15a and the like without annealing or together with annealing.

Moreover, although the PECVD apparatus is used in the foregoing embodiment and a furnace for use in annealing is used for improving the properties of the film, for achieving the immediate improvement in the film quality without exposing the film to the air, the CVD apparatus and the furnace for use in annealing should be used at a state where they are connected by a load-locking chamber to constitute the whole of the film formation apparatus.

As described above, in the first to third embodiments, since the insulating film containing a high concentration of $P_2O_3$ as a phosphorus component is formed, the fluidizing-temperature can be significantly decreased to 500° C. or less.

Accordingly, these films can be used as the interlayer insulating film for covering an aluminum wirings. Moreover, even when these films are used as a underlying insulating film for the wiring layer in semiconductor devices having a shallow diffusion layer with an improvement in integration level, it is possible to prevent a redistribution of impurities in the diffusion layer.

Moreover, since a flattening technology such as a CMP method is not required and the interlayer insulating layer can be flattened by thermally fluidizing the phosphorus-containing film, the concave portions between the wiring layers can be perfectly buried without gaps.

Moreover, since the oxidative gas is added in a suitable amount, a reasonable film-forming rate can be maintained.

(Investigation Result of Film Quality of Phosphorus-containing Insulating Film)

Regarding the PSG film 14 formed by the film formation method of the foregoing embodiment, investigated were the component in the phosphorus-containing insulating film by a Fourier Transformation infrared specrophotometric (FTIR) method, the decreasing rate of phosphorus in the phosphorus-containing insulating film, the contraction rate of the phosphorus-containing insulating film, and the appearance of the film using an electron microscope were investigated. The investigation was conducted for the PSG film 14 which had been subjected to annealing described in the third embodiment.

The investigation results will be described with reference to FIGS. 10 to 16 below.

Figure 10A:
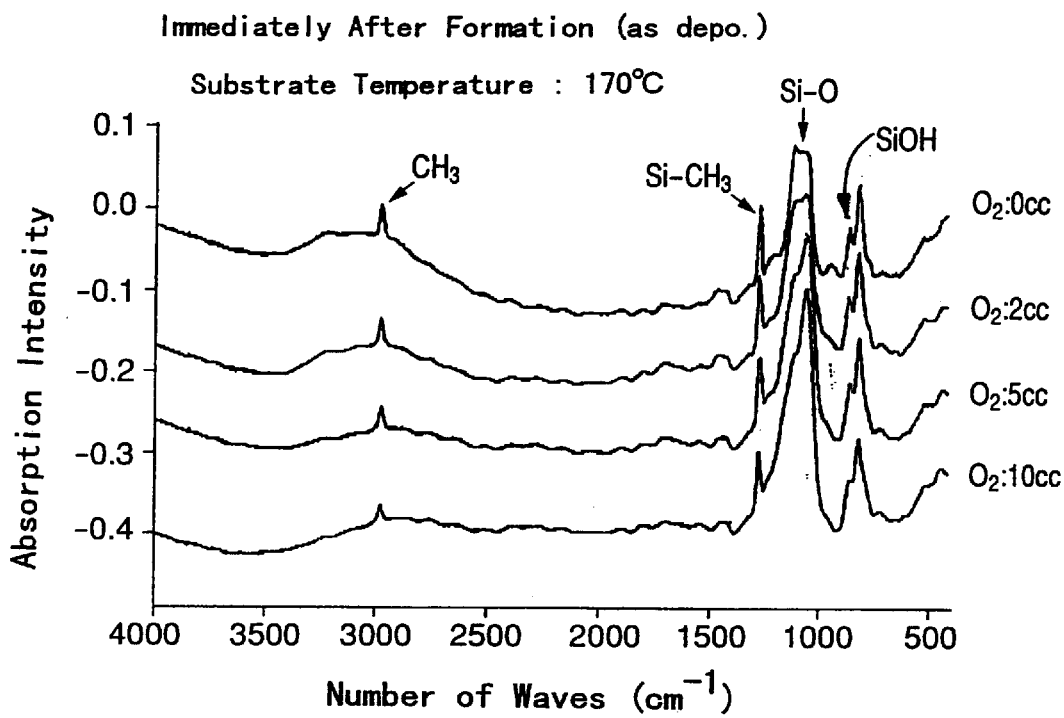
FIG. 10A is a graph showing the result of a component analysis for the PSG film immediately after the formation of the film, which is formed by the film formation method according to the embodiment of the present invention.
Figure 10B:
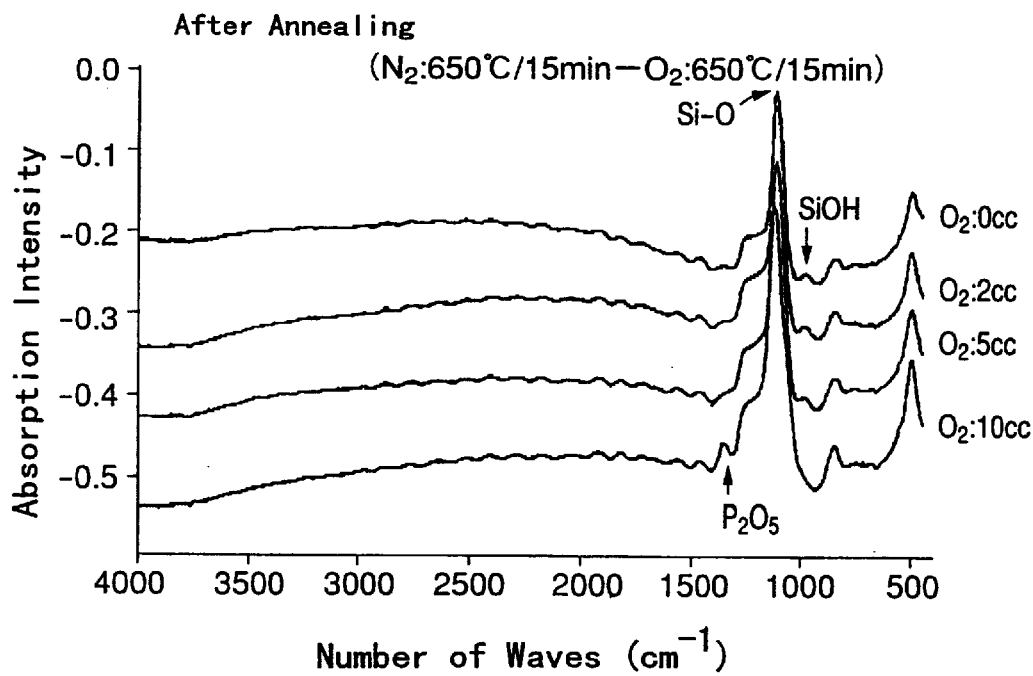
FIG. 10B is a graph showing the result of a component analysis for the PSG film after annealing the film.

FIGS. 10A and 10B are a graph showing the result of the component analysis using the FTIR method. FIG. 10A shows the analysis result of the film immediately after forming it (referred to as 'as depo.'), and FIG. 10B shows the analysis result of the film after annealing. Each of the graphs in FIGS. 10A and 10B uses the flow rate (sccm) of oxygen ($O_2$) as a parameter. Furthermore, the ordinate of each of the graphs in FIGS. 10A and 10B shows an absorption intensity illustrated by an optional unit, and the abscissa thereof shows the number of waves ($cm^{-1}$) illustrated by the linear scales.

The film-forming conditions and the annealing conditions for the sample used for the investigation are as follows. Note that $N_2$ and As in the parenthesis denote carrier gas, and the numerals before the parenthesis denote the conditions when any of the carrier gases is used.

TABLE 6

Film-Forming Conditions

| | |
|---|---|
| Substrate Temperature: | 170° C. |
| Gas Pressure within Chamber: | 3 Torr ($N_2$) |
| | 8 Torr (Ar) |
| Flow Rate of SiOP-11(b) Bubbling Gas: | 400 sccm ($N_2$) |
| (Temperature of SiOP-11(b) Source: 45° C. (21 Torr)) | 627 sccm (Ar) |
| Flow Rate of HMDSO Bubbling Gas: | 250 sccm ($N_2$) |
| (Temperature of HMDSO Source: 10° C. (26 Torr)) | 313 sccm (Ar) |
| Flow Rate of Diluent gas: | 110 sccm ($N_2$) |
| | 0 sccm (Ar) |
| Flow Rate of Oxidative Gas ($O_2$): | 0, 2, 5 and 10 sccm |
| RF power: | 150 W |
| Frequency: | 13.56 MHz |
| Space between Upper and Lower Electrodes: | 25 mm |

Annealing Conditions

| | |
|---|---|
| First Atmosphere Gas: | $N_2$ |
| Processing Temperature: | 650° C. |
| Time: | 15 minutes |
| Second Atmosphere Gas: | $O_2$ |
| Processing Temperature: | 650° C. |
| Time: | 15 minutes |

According to the result of the component analysis using the FTIR method, the absorption of $CH_3$, Si—$CH_3$ and Si—OH are confirmed for all samples immediately after formation of the film. The absorption intensity becomes lower as the addition of oxygen increases. On the other hand, after annealing, the absorption of $CH_3$ and Si—$CH_3$ vanishes for all samples after annealing. Though the absorption of Si—OH can be confirmed for the samples with the oxygen addition of 0 sccm, 2 sccm and 5 sccm, respectively, there is no large difference in the absorption of Si—OH among the samples, and the absorption significantly decreases compared to that immediately after the film formation. On the other hand, when the addition of oxygen is 10 sccm, the absorption of Si—OH vanishes.

After annealing, the absorption of P=O ($P_2O_5$) that is a double bond of phosphorus and oxygen can not be confirmed for all of samples with the oxygen addition of 0 sccm, 2 sccm and 5 sccm, and when the oxygen addition is 10 sccm, the absorption of P=O ($P_2O_5$) can be confirmed.

Hereupon, the absorption of $P_2O_3$ can not be inherently confirmed by the FTIR method, and only the absorption of $P_2O_5$ can be detected. The result of the investigation was studied from the point of view. It is considered reasonable to understand that the absorption of $P_2O_5$ was not detected in case of the small oxygen addition after annealing such as 0 sccm, 2 sccm and 5 sccm because $P_2O_3$ was converted into $P_2O_5$ in only a small amount. Actually, when the addition amount of oxygen was 10 sccm, the amount of the coversion of $P_2O_3$ to $P_2O_5$ by annealing was large to increase the concentration of $P_2O_5$ to a level as high as the order of 7%, thereby making it possible to observe the absorption of $P_2O_5$.

As described above, as the addition amount of oxygen into the film-forming gas increases, a preferable situation is brought about because the amount of impurities such as C and H in the grown film decreases. However, the conversion from $P_2O_3$ to $P_2O_5$ is promoted, and the fluidizing temperature in the flattening step is elevated, resulting in early solidification of the grown film.

For this reason, it will be necessary to allow the amount of the impurities in the grown film to fall within a range within which a practical problem is not generated and to control the amount of oxygen to be added in the grown film so as to obtain a fluidizing temperature as low as possible.

Then, the impurities in the grown film should be reduced by annealing after the film formation and flattening step.

Figure 11:
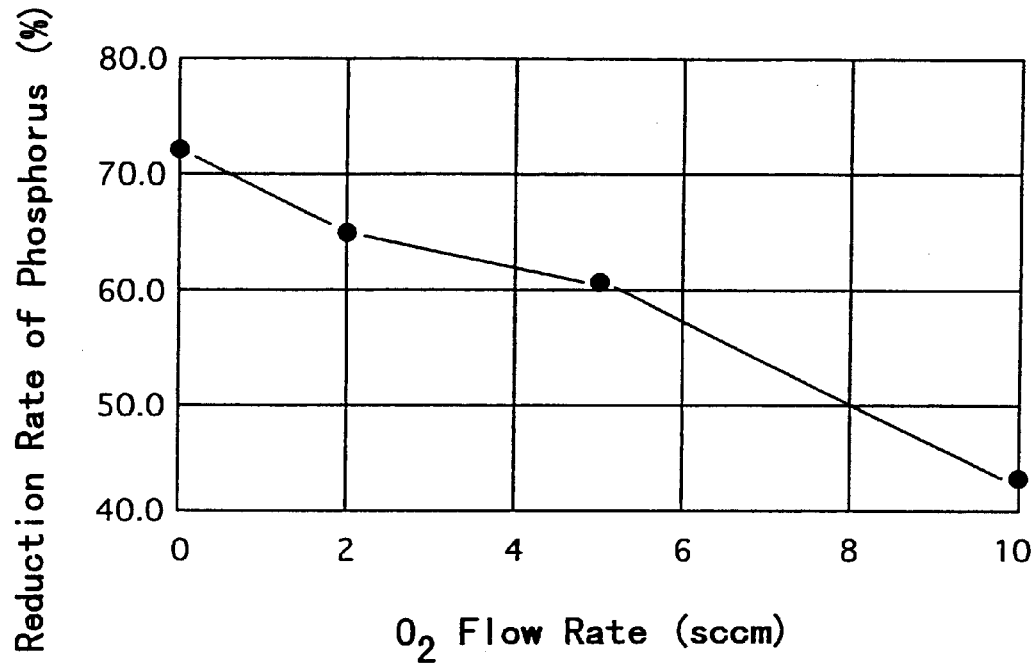
FIG. 11 is a graph showing a correlation between a reduction rate of phosphorus in the PSG film and an $O_2$ addition amount in a film-forming gas, in the film formation method of the PSG film according to the embodiment of the present invention.

FIG. 11 is a graph showing a dependency of the reduction rate of phosphorus in the phosphorus-containing insulating film on the flow rate. The ordinate of FIG. 11 shows the reduction rate (%) of phosphorus illustrated with linear scales, and the abscissa of FIG. 11 shows the flow rate (sccm) of oxygen ($O_2$) illustrated with linear scales.

The film-forming conditions of the samples used for the investigations are as follows.

TABLE 7

| | |
|---|---|
| Substrate Temperature: | 250° C. |
| Gas Pressure in Chamber: | 3 Torr |
| Flow Rate of SiOP-11(b) Bubbling Gas ($N_2$): | 400 sccm |
| Temperature of SiOP-11(b) Container: | 45° C. (21 Torr) |
| Flow Rate of HMDSO Bubbling Gas ($N_2$): | 250 sccm |
| Temperature of HMDSO Container: | 10° C. (26 Torr) |
| Flow Rate of Diluent gas ($N_2$): | 110 sccm |
| Flow Rate of Oxidative Gas ($O_2$): | 0, 2, 5 and 10 sccm |
| RF power: | 150 W |
| Frequency: | 13.56 MHz |
| Space between Upper and Lower Electrode: | 25 mm |

According to the result shown in FIG. 11, as the addition amount of oxygen increases, the reduction rate of phosphorus decreases.

Figure 12:
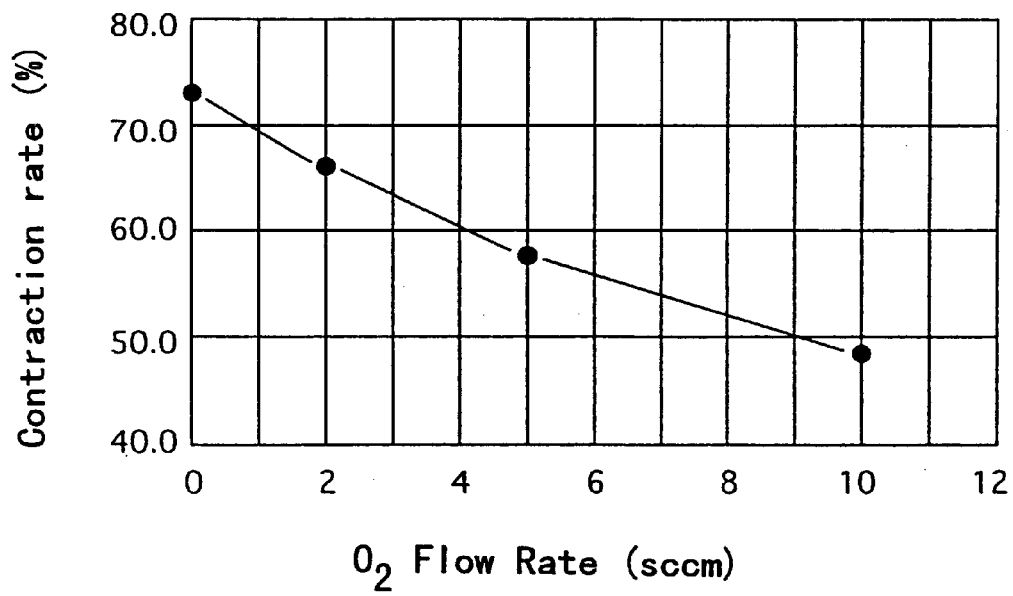
FIG. 12 a graph showing a correlation between a contraction rate of the PSG film and an $O_2$ addition amount in the film-forming gas, in the film formation method of the PSG film according to the embodiment of the present invention.

FIG. 12 is a graph showing a dependency of the contraction rate of the phosphorus-containing insulating film on the $O_2$ flow rate. The ordinate of FIG. 12 shows the contraction rate (%) of the phosphorus-containing insulating film illustrated with linear scales, and the abscissa of FIG. 12 shows the $O_2$ flow rate (sccm) illustrated with linear scales.

The film-forming conditions of the samples used in the investigation are the same as those in the case of FIG. 11.

According to the results shown in FIG. 12, as the addition amount of oxygen increases, the contraction rate decreases.

From the investigation results shown in FIGS. 11 and 12 described above, the reason why the reduction rate of phosphorus decreases as the addition amount of oxygen increases and as the contraction rate of the phosphorus-containing insulating film decreases, is considered as follows. Specifically, as the addition amount of oxygen increases, the decomposition of the grown film immediately after the film formation is promoted, and phosphorus immediately after the film formation is converted from trivalent phosphorus to pentavalent phosphorus by the addition of oxygen.

FIGS. 13, 14 and 15 are photographs of the cross section of the substrate 101 obtained by observing the section of the deposited film with an electron microscope immediately after the film formation and after annealing. These photographs are intended to clarify the difference between the presence and absence of oxygen as the oxidative gas.

Figure 13A:
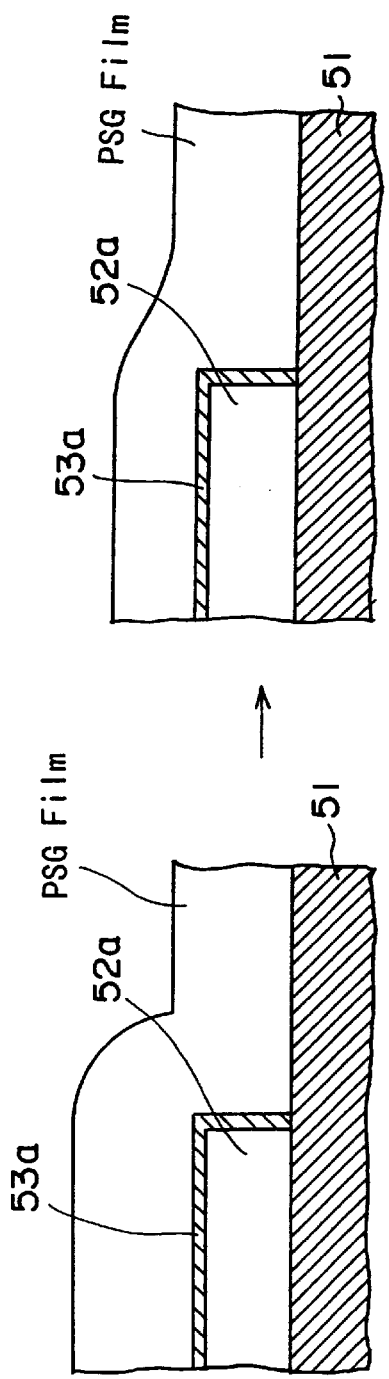
FIGS. 13A and 13B are sectional photographs of the PSG film formed on a substrate using $N_2$ carrier gas and a film-forming gas to which an oxidative gas is added, according to the embodiment of the present invention.
Figure 13B:
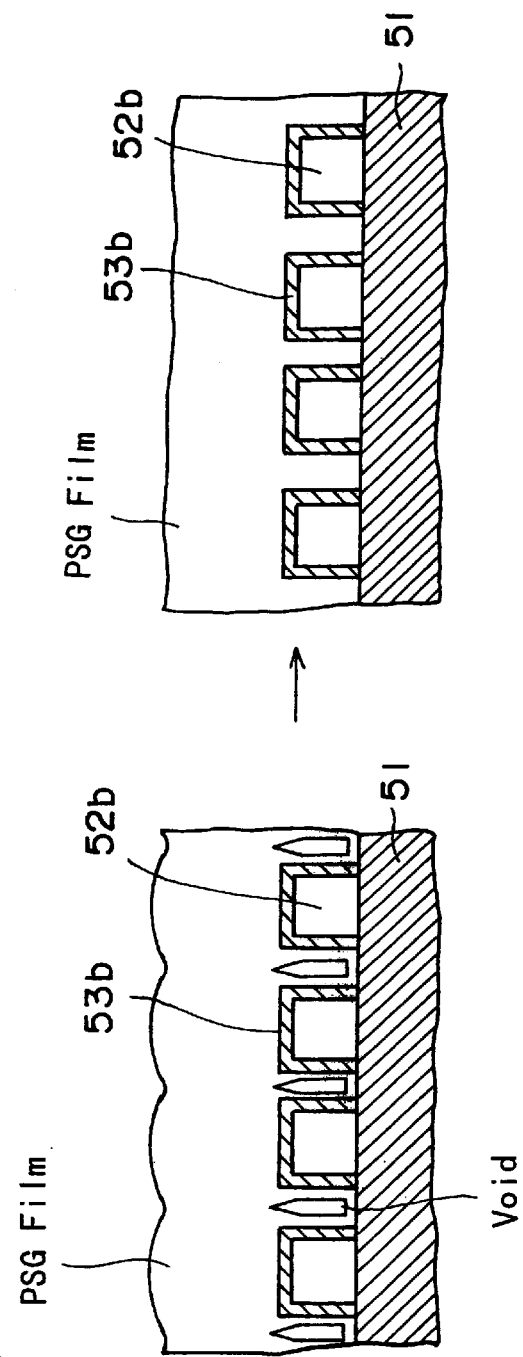
Figure 14A:
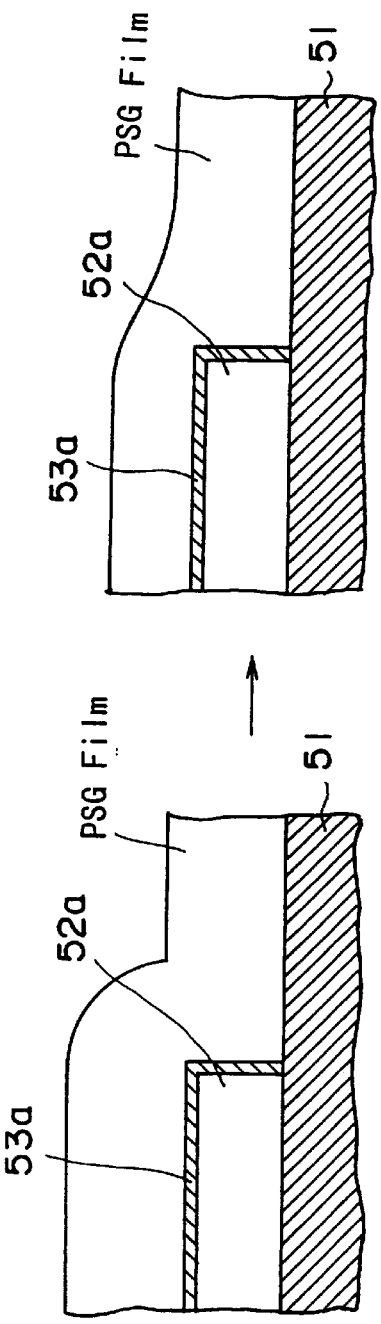
FIGS. 14A and 14B are a sectional photograph of the PSG film formed on a substrate using $N_2$ carrier gas and a film-forming gas to which no oxidative gas is added, according to the embodiment of the present invention.
Figure 14B:
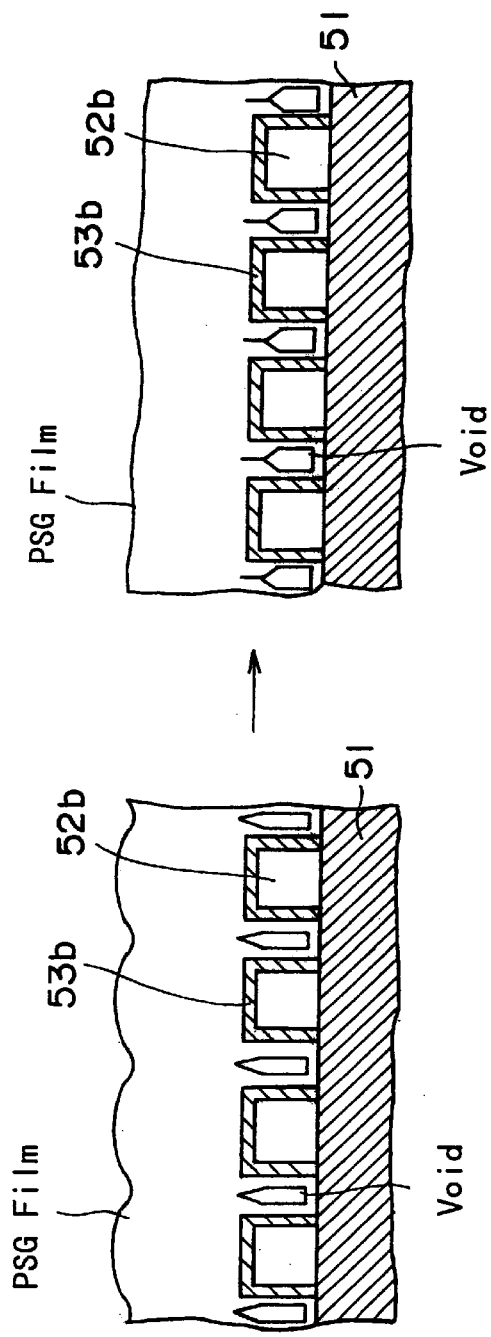
Figure 15A:
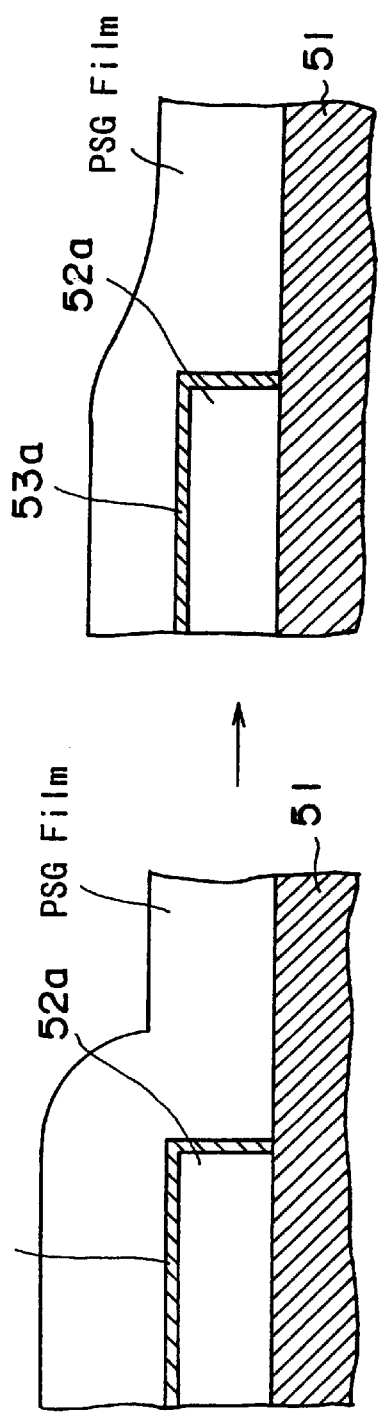
FIGS. 15A and 15B are sectional photographs of the PSG film formed on a substrate using Ar carrier gas and a film-forming gas to which an oxidative gas is added, according to the embodiment of the present invention.
Figure 15B:
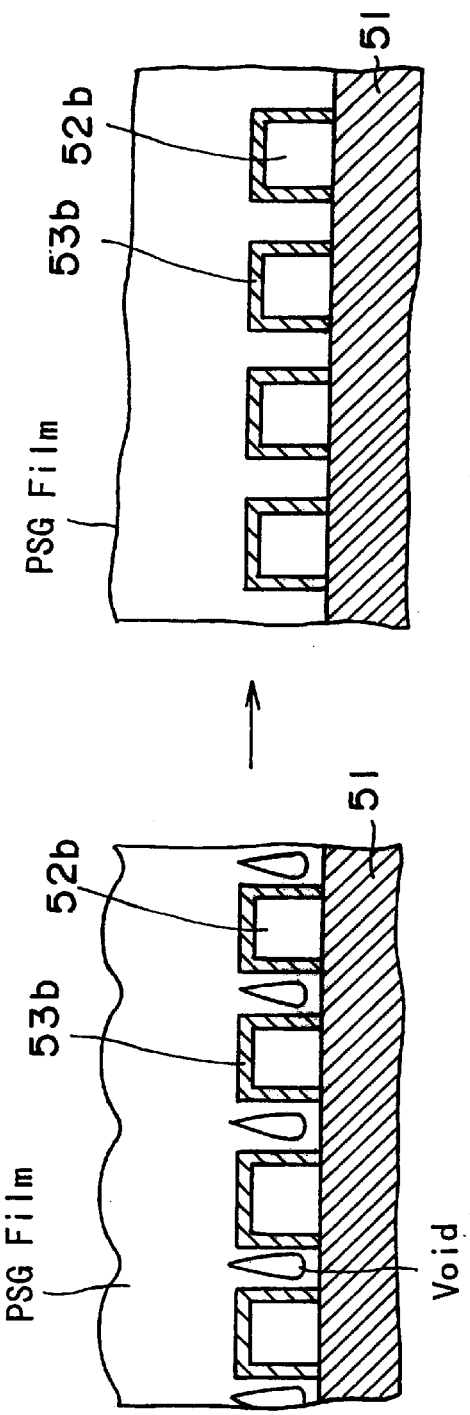
Figure 16A:
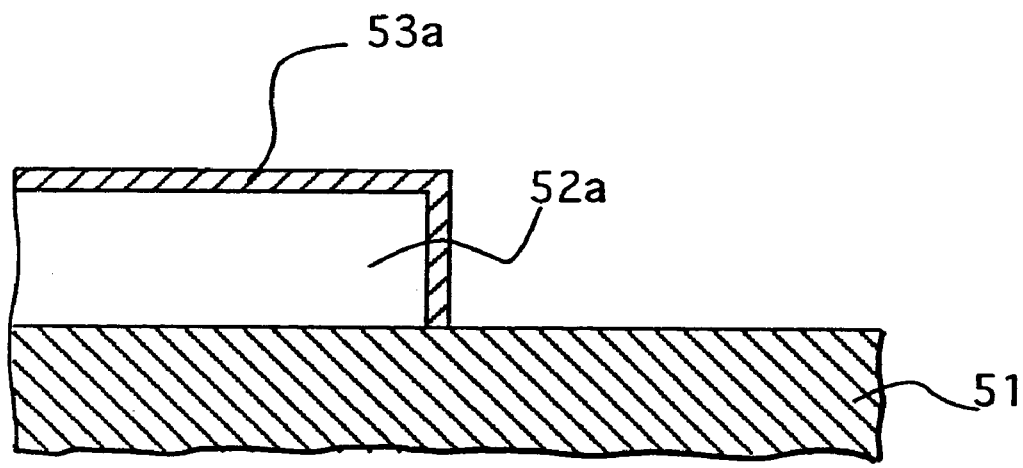
FIGS. 16A and 16B are sectional views of the substrate before the film formation thereon, which was used for the investigation of FIGS. 13A to 15A and FIGS. 13B to 15B, respectively.
Figure 16B:
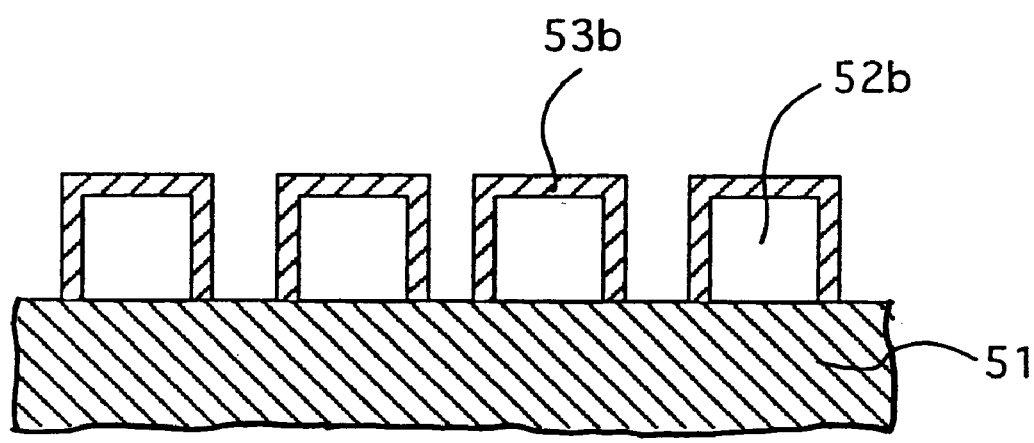

With reference to the substrate 101 in which the film is not formed thereon yet, FIGS. 13A, 14A and 15A illustrate a part of the substrate 101 where the doped polysilicon film 52a having a film thickness of about 0.5 µm, which is deposited on the thermal oxide underlying film 51, is patterned and the thermal oxide film 53a of a film thickness of about 0.1 µm is formed thereon to form a step difference portion as shown in FIG. 16A. Moreover, FIGS. 13B, 14B and 15B illustrate the another part of the substrate 101 where the doped polysilicon film 52a having a film thickness of about 0.4 µm, which is deposited on the thermal oxide underlying film 51, is patterned to form a plurality of belt-shaped layers 52b disposed at intervals of about 0.35 µm and the thermal oxide film 53b having a film thickness of about 0.1 µm is formed thereon, as shown in FIG. 16B.

The film-forming conditions of the samples used for the investigations shown in FIGS. 13A and 13B were set to be the same as those used for the investigations shown in FIG. 11. Note that $O_2$ as the oxidative gas was added by the flow rate of 2 sccm.

Further, the film-forming conditions of the samples used for the investigations shown in FIGS. 14A and 14B were set to be the same as those used for the investigations shown in FIGS. 13A and 13B. Note that $O_2$ was not added. The annealing conditions in FIGS. 14A and 14B were set to be the same as those of the samples used for the investigations of FIGS. 10A and 10B.

Still further, the film-forming conditions of the samples used for the investigations of FIGS. 15A and 15B were set to be the same as those used for the investigations of FIGS. 10A and 10B. In this case, Ar was used as the carrier gas, and $O_2$ as the oxidative gas was added at a flow rate of 2 sccm. Moreover, as the annealing conditions, $N_2$ gas was used as the atmospheric gas, the substrate temperature was set at 650° C., and the treatment time was set to five minutes.

According to the results shown in FIGS. 13A to 15A and FIGS. 13B to 15B, voids, which were created in its super fine portions (0.12 μm) immediately after the film formation, were vanished in the film formed by adding oxygen, as shown in FIG. 13B. On the other hand, the voids, which were created immediately after the film formation, failed to be filled in the film formed by adding no oxygen, as shown in FIG. 14B.

In the case of the film shown in FIG. 15, which was formed by using Ar gas instead of $N_2$ gas as the carrier gas, a flow shape (not shown), which is defined as the state of a smooth surface including a flat surface resulting from flow of the film, could not be obtained in the film formed by adding no oxygen. On the other hand, when the film formed by adding oxygen at a flow rate of 2 sccm was observed by an electron microscope, it was observed that the flow shape of the interlayer insulating film according to the shape of the step difference shown in FIG. 15A was obtained, and a concave portion between the belt-shaped layers, which had a depth of 0.4 to 0.5 μm and was disposed at intervals of 0.15 μm, was found to have been completely filled, as shown in FIG. 15B. It should be noted that observation of super fine portions were not performed.

From the above described result, it is considered that if the addition amount of oxygen is too large, dissipation of phosphorus is reduced from the insulating film because of the creation of pentavalent phosphorus. However, the insulating film immediately after the film formation is promoted in the flow shape by adding the small amount of oxygen, thus filling the concave portions more perfectly. The addition amount of oxygen should be set at a flow rate of 15 sccm or less, more preferably below 10 sccm.

Although the preferred embodiment of the present invention has been described in detail, it should be understood that various changes and alternations can be made without departing from the spirit and scope of the invention as defined by the appended claims.

For example, although the annealing temperature is set at 650° C. in the third embodiment, this invention is not limited to this temperature, and the annealing temperature may be a temperature below 650° C., or preferably below 500° C.

Moreover, though HMDSO is used for the silicon-containing compound, other silicon-containing compounds containing at most one oxygen atom may be used.

Though $N_2$ or Ar gas is used as the carrier gas, He gas may be also used.

$O_2$ gas is used as the oxidative gas, and, as a matter of course, other oxidative gases, for example, CO, $CO_2$, NO, $N_2O$ and $NO_2$ may be used. Alternatively, the oxidative gas should not be necessarily added.

Moreover, as the film formation apparatus for embodying the PECVD method, the parallel plane type PECVD apparatus is used. However, the present invention is not limited to this. Other PECVD apparatuses such as an ECR (Electron Cyclotron Resonance) type PECVD apparatus can be used.

The frequency of the RF power for converting the gas into a plasma is not limited to 13.56 MHz, and the RF power with a frequency ranging from 380 kHz to 2.45 GHz may be used.

As described above, in the present invention, the phosphorus-containing insulating film is formed in such a manner that a small amount of oxidative gas is added to the mixed gas obtained by mixing the phosphorus-containing compound containing trivalent phosphorus with the silicon-containing compound containing oxygen at most one atom. Or, the insulating film is formed by adding no oxidative gas to that mixed gas.

Accordingly, since the phosphorus-containing insulating film can be formed under the state of oxygen shortage, the phosphorus-containing insulating film with a high concentration of $P_2O_3$ can be formed, and the fluidizing temperature can be significantly lowered to 500° C. or less. By adding a small amount of oxidative gas, the film-forming rate can be maintained. By adding a small amount of oxidative gas, the film-forming rate can be maintained.

Moreover, by fluidizing the phosphorus-containing insulating film, the interlayer insulating film can be flattened, so that the concave portions between the wiring layers can be filled completely.

What is claimed is:

1. A film formation method comprising the steps of:

activating a film-forming gas by converting the film-forming gas into a plasma, said film-forming gas containing a phosphorus-containing compound, and a silicon-containing compound, said phosphorus-containing compound containing trivalent phosphorus and having a Si—O—P structure, and said silicon-containing compound containing at most one oxygen atom; and allowing components of said film forming gas to react with each other in an oxygen deficient state to form a phosphorus-containing insulating film containing $P_2O_3$ on a substrate.

2. The film formation method according to claim 1, wherein said film forming gas additionally contains an oxidative gas.

3. The film formation method according to claim 2, wherein said oxidative gas is any one of $O_2$, CO, $CO_2$, NO, $N_2O$ and $NO_2$.

4. The film formation method according to claim 1, wherein said phosphorus-containing compound which contains said trivalent phosphorus and takes said Si—O—P structure has any one of the following structural formulae.

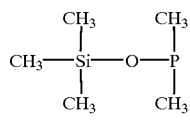

Or

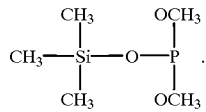

5. The film formation method according to claim 1, wherein after the formation of the phosphorus-containing insulating film containing $P_2O_3$, said phosphorus-containing insulating film is heated at an atmosphere containing oxygen thereby converting $P_2O_3$ contained in said phosphorus-containing insulating film into $P_2O_5$.

6. The film formation method according to claim 1, wherein after the formation of the phosphorus-containing insulating film containing $P_2O_3$, said phosphorus-containing insulating film is heated to fluidize said phosphorus-containing insulating film, thereby flattening said phosphorus-containing insulating film.

7. The film formation method according to claim 6, wherein a temperature for heating said phosphorus-containing insulating film is equal to 700° C. or less.

8. The film formation method according to claim 6, wherein after the phosphorus-containing insulating film is heated to fluidize said phosphorus-containing insulating film, thereby flattening said phosphorus-containing insulating film, the phosphorous-containing insulating film is heated under an atmosphere containing oxygen, thereby converting $P_2O_3$ contained in said phosphorus-containing-insulating film into $P_2O_5$.

9. A manufacturing method of a semiconductor device comprising the steps of:

forming a wiring layer on an underlying insulating layer;

activating a film-forming gas by converting said film-forming gas into a plasma, said film-forming gas containing a phosphorus-containing compound, a silicon-containing compound and an oxidative gas, said phosphorus-containing compound containing trivalent phosphorus and having a Si—O—P structure, and said silicon-containing compound containing at most one oxygen atom; and allowing components of said film forming gas to react with each other in an oxygen deficient state, thereby forming a phosphorus-containing insulating film containing $P_2O_3$ so as to cover said wiring layer on said underlying insulating layer.

10. A manufacturing method of a semiconductor device comprising the steps of:

forming a wiring layer on an underlying insulating layer;

activating a film-forming gas by converting said film-forming gas into a plasma, said film-forming gas consisting of a phosphorus-containing compound and a silicon-containing compound, said phosphorus-containing compound containing trivalent phosphorus and having a Si—O—P structure, and said silicon-containing compound containing at most one oxygen atom; and allowing components of said film forming gas to react with each other in an oxygen deficient state, thereby forming a phosphorus-containing insulating film containing $P_2O_3$ so as to cover said wiring layer on said underlying insulating layer.

* * * * *